(12) United States Patent
Okuno et al.

(10) Patent No.: US 10,845,578 B2
(45) Date of Patent: Nov. 24, 2020

(54) LIGHT SOURCE DEVICE AND PROJECTION DISPLAY APPARATUS

(71) Applicant: Panasonic Intellectual Property Management Co., Ltd., Osaka (JP)

(72) Inventors: Manabu Okuno, Osaka (JP); Yohei Katsumata, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/776,958

(22) Filed: Jan. 30, 2020

(65) Prior Publication Data

US 2020/0249449 A1 Aug. 6, 2020

(30) Foreign Application Priority Data

Feb. 5, 2019 (JP) .................................. 2019-018782

(51) Int. Cl.
| | |
|---|---|
| G03B 21/14 | (2006.01) |
| H04N 9/31 | (2006.01) |
| G02B 13/16 | (2006.01) |
| G02B 27/30 | (2006.01) |
| G03B 21/28 | (2006.01) |
| G02B 26/00 | (2006.01) |
| G03B 21/00 | (2006.01) |
| G03B 21/20 | (2006.01) |
| H01S 5/022 | (2006.01) |

(52) U.S. Cl.
CPC ............ *G02B 13/16* (2013.01); *G02B 26/008* (2013.01); *G02B 27/30* (2013.01); *G03B 21/008* (2013.01); *G03B 21/204* (2013.01); *G03B 21/28* (2013.01); *H01S 5/02288* (2013.01)

(58) Field of Classification Search
CPC .... G03B 21/14; G03B 21/003; G03B 21/005; G03B 21/006; G03B 21/008; G03B 21/2013; G03B 21/2033; G03B 21/204; G03B 21/208; H04N 9/31; H04N 9/3012; H04N 9/3111; H04N 9/3108; G02B 13/16; G02B 26/008; H01S 5/02288
See application file for complete search history.

(56) References Cited

U.S. PATENT DOCUMENTS

| | | | |
|---|---|---|---|
| 10,466,579 B2* | 11/2019 | Akiyama | ........... G02B 27/1006 |
| 2015/0192848 A1* | 7/2015 | Okuno | ...................... F21V 7/00 |
| | | | 348/759 |
| 2016/0065919 A1 | 3/2016 | Miyata et al. | |
| 2016/0198135 A1 | 7/2016 | Kita et al. | |

(Continued)

FOREIGN PATENT DOCUMENTS

| | | |
|---|---|---|
| JP | 10-293269 | 11/1998 |
| JP | 2012-137608 | 7/2012 |

(Continued)

*Primary Examiner* — William C. Dowling
(74) *Attorney, Agent, or Firm* — Wenderoth, Lind & Ponack, L.L.P.

(57) ABSTRACT

A light source device 20 includes light source units 200a to 200d, lenses 203a, 203b, and 205, and mirrors 204a and 204b. Light source units 200a, 200b and/or light source units 200c, 200d are placed such that the light from units 200a to 200d either enters lens 203a at a position deviated from the optical axis of lens 203a or enters lens 203b at a position deviated from the optical axis of lens 203b.

5 Claims, 16 Drawing Sheets

(56) References Cited

U.S. PATENT DOCUMENTS

2016/0334695 A1  11/2016  Yamada et al.
2020/0026170 A1* 1/2020  Chang .................. G03B 21/204

FOREIGN PATENT DOCUMENTS

| | | |
|---|---|---|
| JP | 2012-189938 | 10/2012 |
| JP | 2013-114980 | 6/2013 |
| JP | 2016-31402 | 3/2016 |
| JP | 2016-51072 | 4/2016 |
| JP | 6141512 | 6/2017 |
| JP | 2019-101200 | 6/2019 |
| WO | 2015/056381 | 4/2015 |

* cited by examiner

LIGHT SOURCE DEVICE AND PROJECTION DISPLAY APPARATUS

BACKGROUND

1. Technical Field

The present disclosure relates to a light source device used in, for example, a projection display apparatus, and also relates to a projection display apparatus including such a light source device.

2. Description of the Related Art

Patent Literature 1 discloses a projection display apparatus which uses, as illumination light, the fluorescence generated by exciting the phosphor on the phosphor wheel by excitation light.

CITATION LIST

Patent Literature

Patent Literature 1: Japanese Unexamined Patent Application Publication No. 2016-031402

SUMMARY

The light source device according to an aspect of the present disclosure includes:
 a first light source unit that emits first light;
 a second light source unit that emits second light;
 a third light source unit that emits third light;
 first, second, and third lenses; and
 a mirror.

The first light enters the third lens after passing through the first lens and the mirror.

The second light enters the third lens after passing through the second lens and being reflected by the mirror.

The third light enters either the first lens or the second lens, the central axis of the third light being displaced from the optical axis of either the first lens or the second lens on which the third light is incident.

The light source device according to another aspect of the present disclosure includes:
 a first light source unit that emits first light;
 a second light source unit that emits second light;
 a third light source unit that emits third light;
 first, second, and third lenses; and
 a mirror.

The first light enters the third lens after passing through the first lens and the mirror.

The second light enters the third lens after passing through the second lens and being reflected by the mirror.

The third light enters either the first lens or the second lens at a non-zero incident angle with respect to the optical axis of either the first lens or the second lens on which the third light is incident.

DETAILED DESCRIPTION

Increasing the luminance of illumination can be achieved by, for example, increasing the number of light source units including semiconductor laser elements. In general, however, an increase in the number of light source units results in the size increase of the light source device as a whole. To overcome this issue, there is a growing demand for high-luminance light source devices without significantly increasing their size.

An object of the present disclosure is to provide a high-luminance light source device without significantly increasing its size.

Exemplary embodiments will be described in detail as follows with reference to the accompanying drawings. However, the description of well-known matters and of substantially the same configuration as described earlier may be omitted to avoid redundancy and help those skilled in the art understand them easily.

Note that the attached drawings and the following description are provided to make those skilled in the art fully understand the present disclosure, and are not intended to limit the claimed subject matter.

First Exemplary Embodiment

The projection display apparatus including the light source device according to the first exemplary embodiment will now be described with reference to FIGS. 1 to 9.

Figure 1:
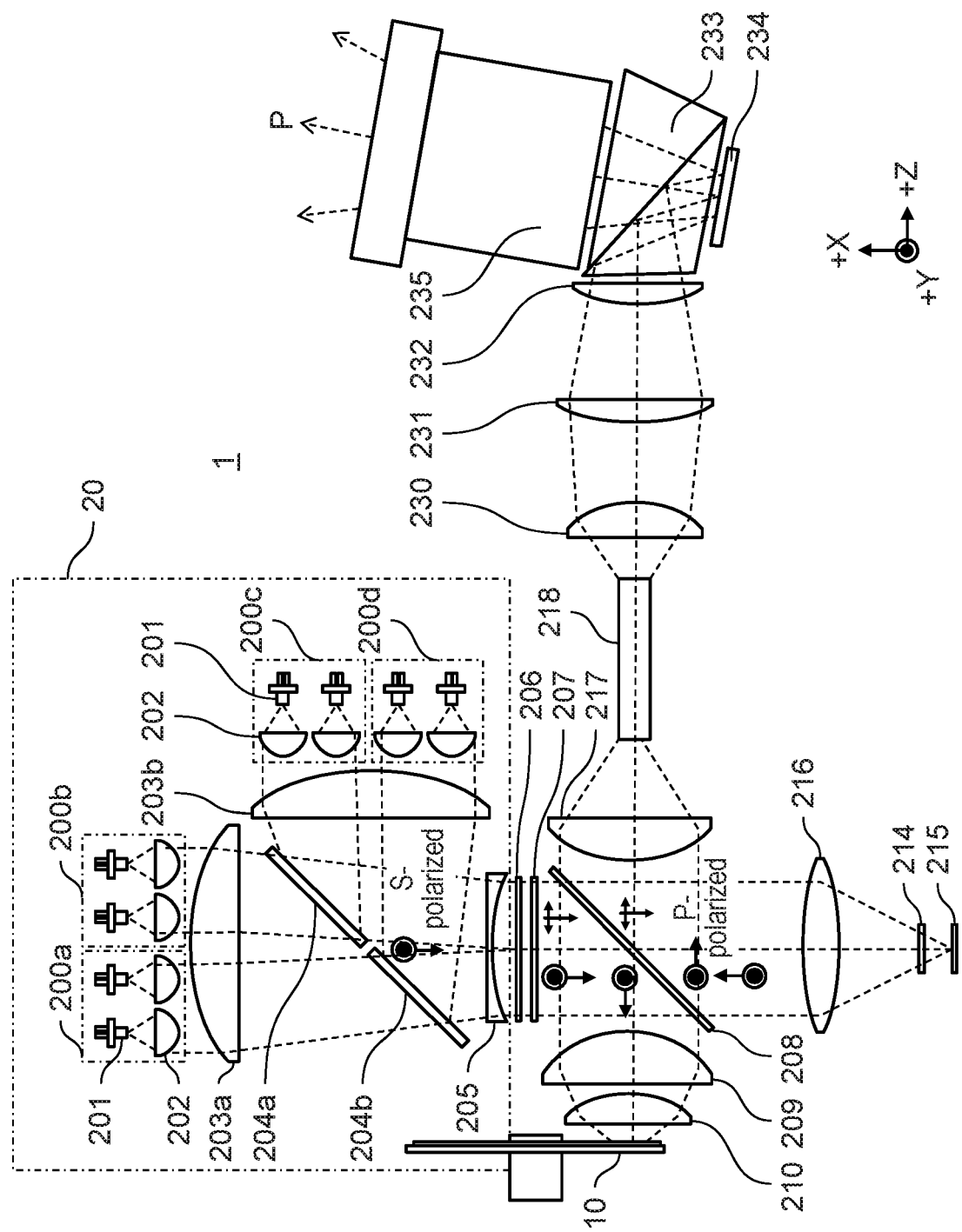
FIG. 1 is a configuration view of projection display apparatus 1 including light source device 20 according to a first exemplary embodiment.

1-1. Configuration of First Exemplary Embodiment 1-1-1. Overall Structure of the Projection Display Apparatus FIG. 1 is a configuration view of projection display apparatus 1 including light source device 20 according to the first exemplary embodiment. Apparatus 1 further includes phosphor wheel 10 as will be described later. The phosphor on phosphor wheel 10 is excited by the light from light source device 20. The following description will be given with reference to the XYZ rectangular coordinate system shown in, for example, FIG. 1.

Projection display apparatus 1 includes the following components: phosphor wheel 10, light source units 200a to 200d, lenses 203a and 203b, reflective mirrors 204a and 204b, lens 205, diffused plate 206, quarter-wave plate 207, dichroic mirror 208, lenses 209 and 210, quarter-wave plate 214, multi-reflection mirror 215, lenses 216 and 217, rod integrator 218, lenses 230, 231, and 232, total internal reflection (TIR) prism 233, digital micromirror device (DMD) 234, and projection lens 235.

Each of light source units 200a to 200d includes at least one pair of semiconductor laser element 201 and collimator lens 202. As will be described later with reference to FIGS. 5 to 8, semiconductor laser elements 201 and collimator lenses 202 in each of light source units 200a to 200d are arranged in a rectangular matrix.

Light source device 20 includes the following components: semiconductor laser elements 201, collimator lenses 202, lenses 203a and 203b, reflective mirrors 204a and 204b, and lens 205.

First, light source device 20 of projection display apparatus 1 will be described as follows.

Each semiconductor laser element 201 generates and emits linearly polarized blue light with a wavelength of 447 nm to 462 nm. In the example shown in FIG. 1, the light from semiconductor laser elements 201 has a polarization direction parallel to the y axis. The light, which is s-polarized, strikes dichroic mirror 208 as will be described later. To achieve high luminance light source device 20, these semiconductor laser elements 201 are arranged in a matrix. Each of light source units 200a to 200d includes two semiconductor laser elements 201 in FIG. 1, but it may alternatively include a larger number of elements 201.

The light from each semiconductor laser element 201 is collimated by the corresponding collimator lens 202, so that the light from each collimator lens 202 is approximately parallel.

Lenses 203a and 203b are convex lenses, whereas lens 205 is a concave lens. The light from collimator lenses 202 of light source units 200a and 200b passes through lens 203a and mirror 204a or 204b, and enters lens 205. Meanwhile, the light from collimator lenses 202 of light source units 200c and 200d passes through lens 203b, is reflected by mirror 204a or 204b, and enters lens 205. Thus, the light from collimator lenses 202 is collected by lens 203a or 203b and again approximately collimated by lens 205.

The light from lens 205 passes through diffused plate 206 and quarter-wave plate 207, and strikes dichroic mirror 208. Diffused plate 206 can be made, for example, of a glass plate whose one side has a diffused surface provided with fine asperities. Quarter-wave plate 207, having an incident plane perpendicular to the X axis, is placed at a predetermined angle with respect to the X axis. The light from semiconductor laser elements 201 passes through quarter-wave plate 207 so as to be converted from linearly polarized light into elliptically-polarized light. Dichroic mirror 208 is placed such that the incident plane is inclined about 45 degrees with respect to the optical axis.

Figure 2:
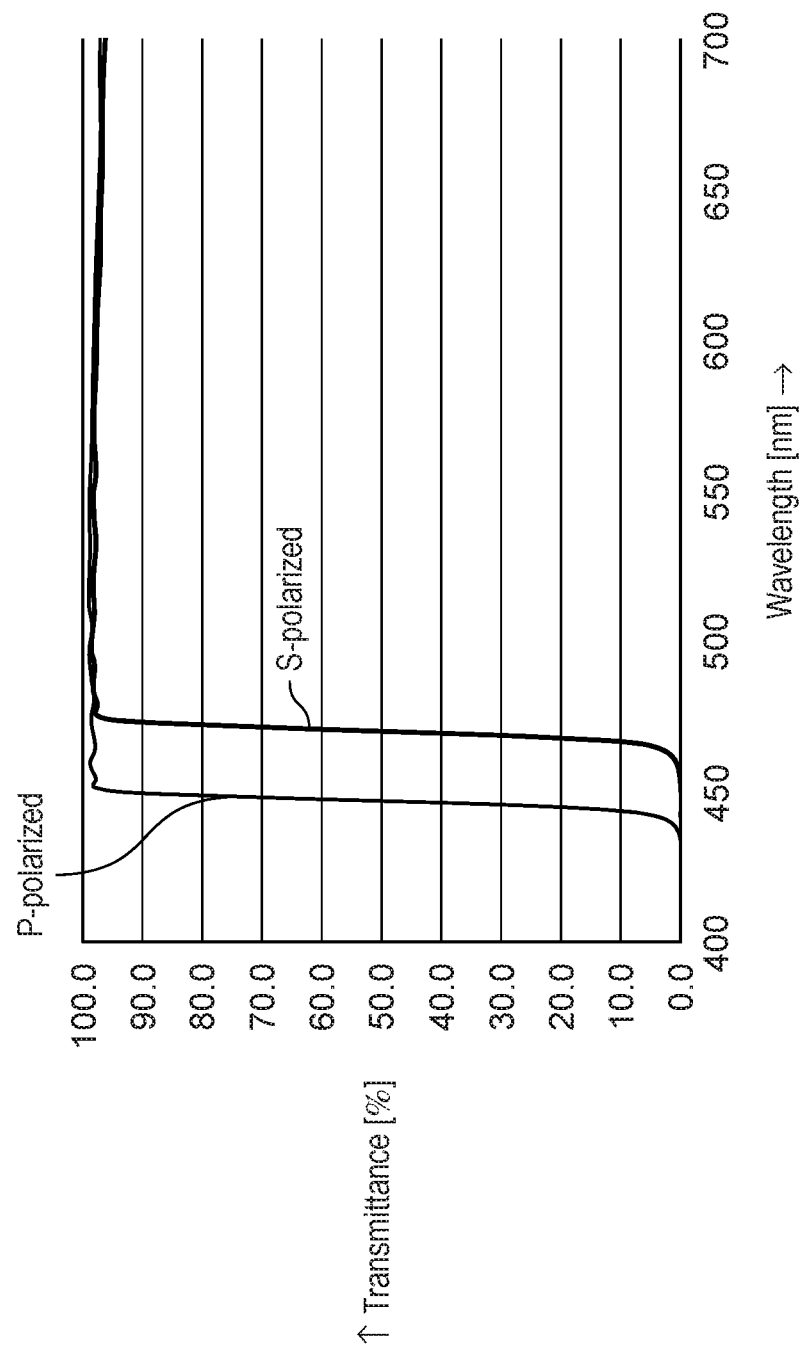
FIG. 2 is a graph showing the spectral characteristics of dichroic mirror 208 shown in FIG. 1.

FIG. 2 is a graph showing the spectral characteristics of dichroic mirror 208 show in FIG. 1. The transmittance of mirror 208 in the blue spectral region is 50% at 465 nm for s-polarized light and at 442 nm for p-polarized light. Mirror 208 transmits 96% or more of the light in the green and red spectral regions, regardless of polarization.

Referring back to FIG. 1, of the light in the blue spectral region incident on dichroic mirror 208 from quarter-wave plate 207, the s-polarized component is reflected by mirror 208 and emitted in the negative z direction. Meanwhile, the p-polarized component passes through mirror 208 and is emitted in the negative x direction. The light emitted in the negative z direction is collected by lenses 209 and 210 and excites the phosphor on phosphor wheel 10.

Figure 3:
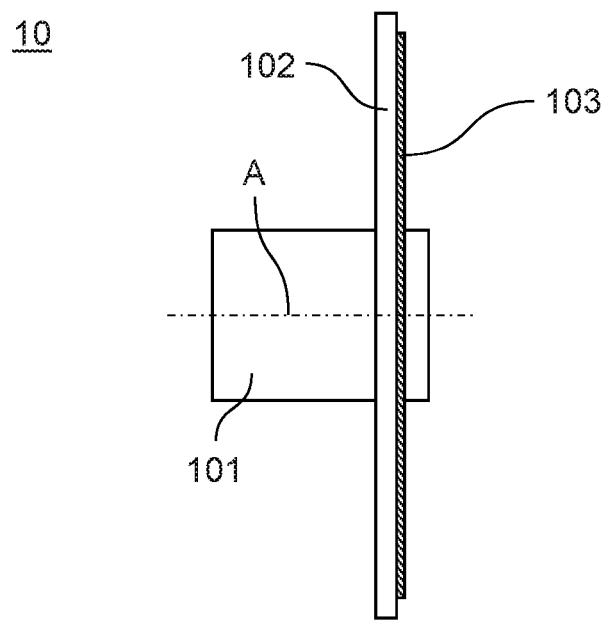
FIG. 3 is a side view of phosphor wheel 10 shown in FIG. 1.
Figure 4:
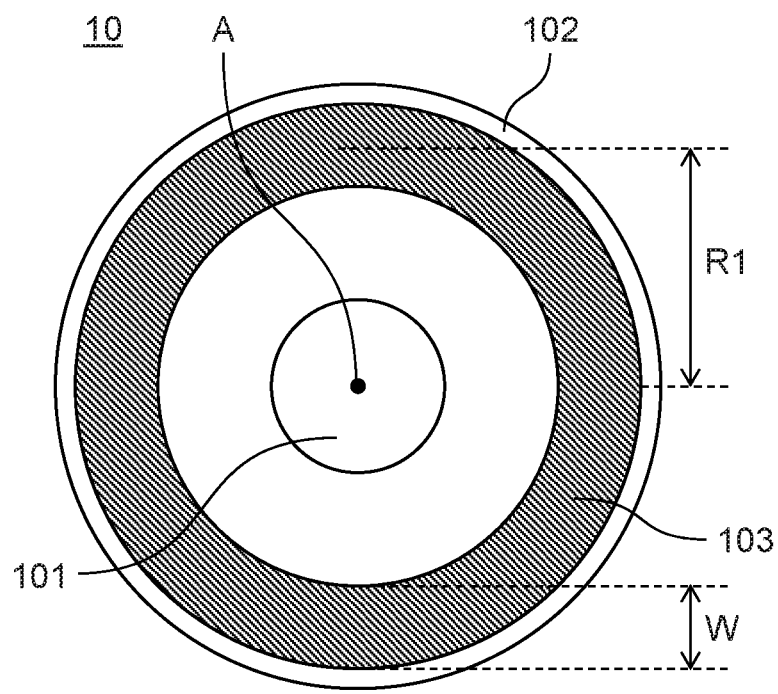
FIG. 4 is a front view of phosphor wheel 10 shown in FIG. 1.

FIG. 3 is a side view of phosphor wheel 10 shown in FIG. 1. FIG. 4 is a front view of wheel 10. As shown in FIGS. 3 and 4, wheel 10 includes motor 101, rotary base 102, and yellow phosphor 103. Rotary base 102, which is disk-shaped, rotates around the rotation axis A of motor 101. As shown in FIG. 4, yellow phosphor 103 has a predetermined width W on rotary base 102. The center of the width W is on the circumference at a distance R1 from the rotation axis A of wheel 10. When the light in the blue spectral region emitted from each semiconductor laser element 201 enters yellow phosphor 103 of wheel 10, yellow phosphor 103 is excited and generates the light in the yellow spectral region (fluorescence).

Referring back to FIG. 1, part of the light in the yellow spectral region generated in yellow phosphor 103 is emitted in the positive z direction from phosphor wheel 10. Meanwhile, the light in the yellow spectral region emitted in the negative z direction from yellow phosphor 103 is reflected by rotary base 102 and emitted in the positive z direction. The light in the yellow spectral region emitted from wheel 10 is collimated by lenses 210 and 209 and passes through dichroic mirror 208.

Meanwhile, of the light in the blue spectral region that enters dichroic mirror 208 from quarter-wave plate 207, the p-polarized light that has passed through mirror 208 and is emitted in the negative x direction passes through lens 216 and quarter-wave plate 214, and strikes multi-reflection mirror 215. Lens 216 collects the incident light coming from mirror 208. The light from lens 216 passes through quarter-wave plate 214 so as to be converted from linearly polarized light into circularly polarized light. Multi-reflection mirror 215 is placed near the focal position of lens 216. The light reflected by multi-reflection mirror 215 passes again through quarter-wave plate 214 and lens 216, and strikes dichroic mirror 208. While passing through quarter-wave plate 214, the light reflected by multi-reflection mirror 215 is converted from circularly polarized light into linearly polarized light. The light from quarter-wave plate 214 is collimated by lens 216. The light from lens 216, striking dichroic mirror 208 as s-polarized light, is reflected by mirror 208 and emitted in the positive z direction.

Thus, the light in the blue spectral region emitted from semiconductor laser elements 201 and the light in the yellow spectral region emitted from phosphor wheel 10 are combined by dichroic mirror 208 into white light. The white light is collected by condenser lens 217 and enters rod integrator 218.

The light from rod integrator 218 passes through lenses 230, 231, and 232 and TIR prism 233, and enters DMD 234. Lenses 230, 231, and 232, which form a relay optical system, have the function of forming an image on DMD 234 from the light coming out of the emission plane of rod integrator 218. DMD 234 is a light modulation element for spatially modulating incident light by a video signal. The light modulated by DMD 234 passes through TIR prism 233 and enters projection lens 235. Projection lens 235 projects the incident light as video light P on a screen in an enlarged scale.

1-1-2. Structure of the Light Source Device

Figure 5:
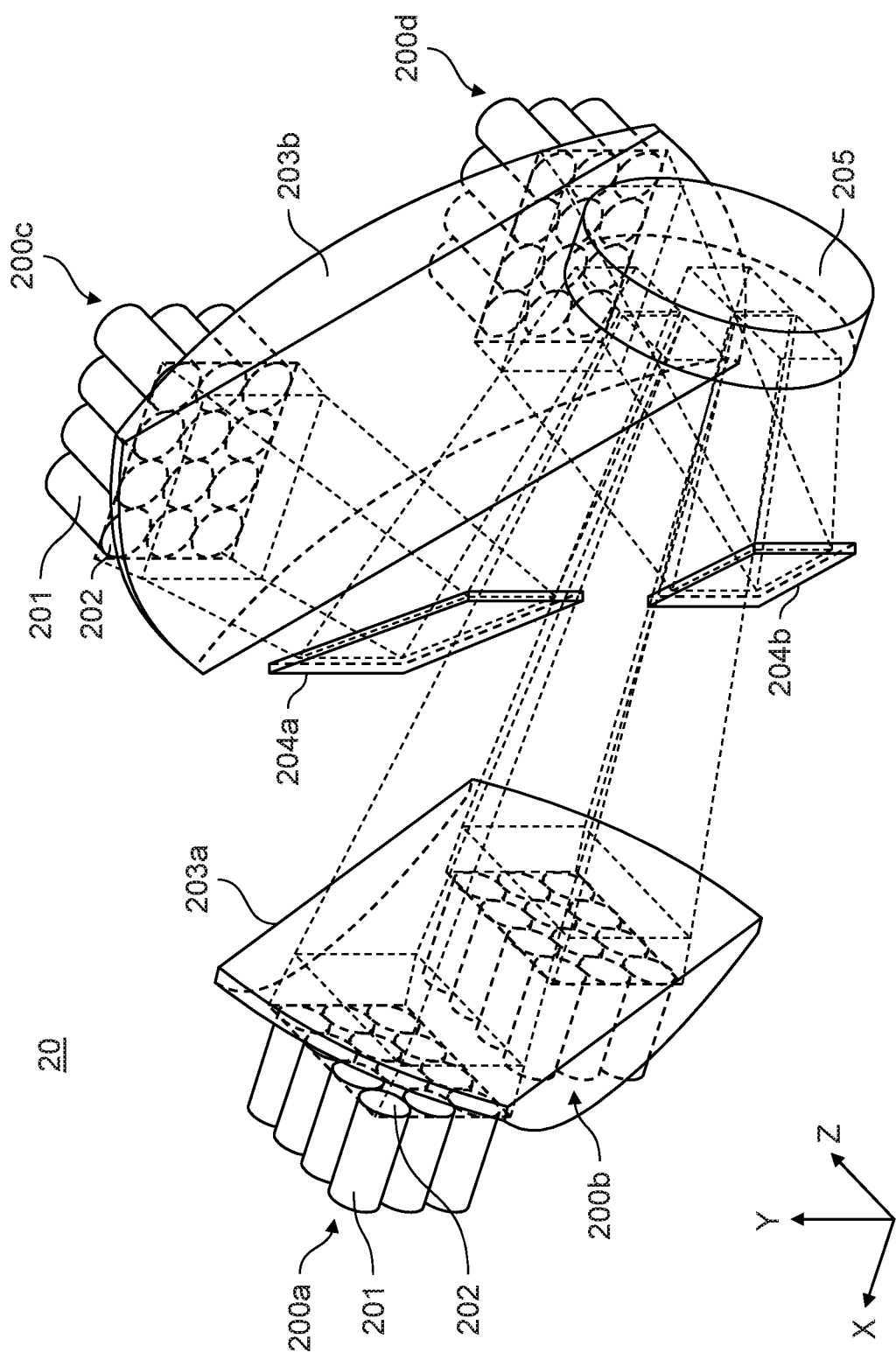
FIG. 5 is a perspective view of light source device 20 shown in FIG. 1.
Figure 6:
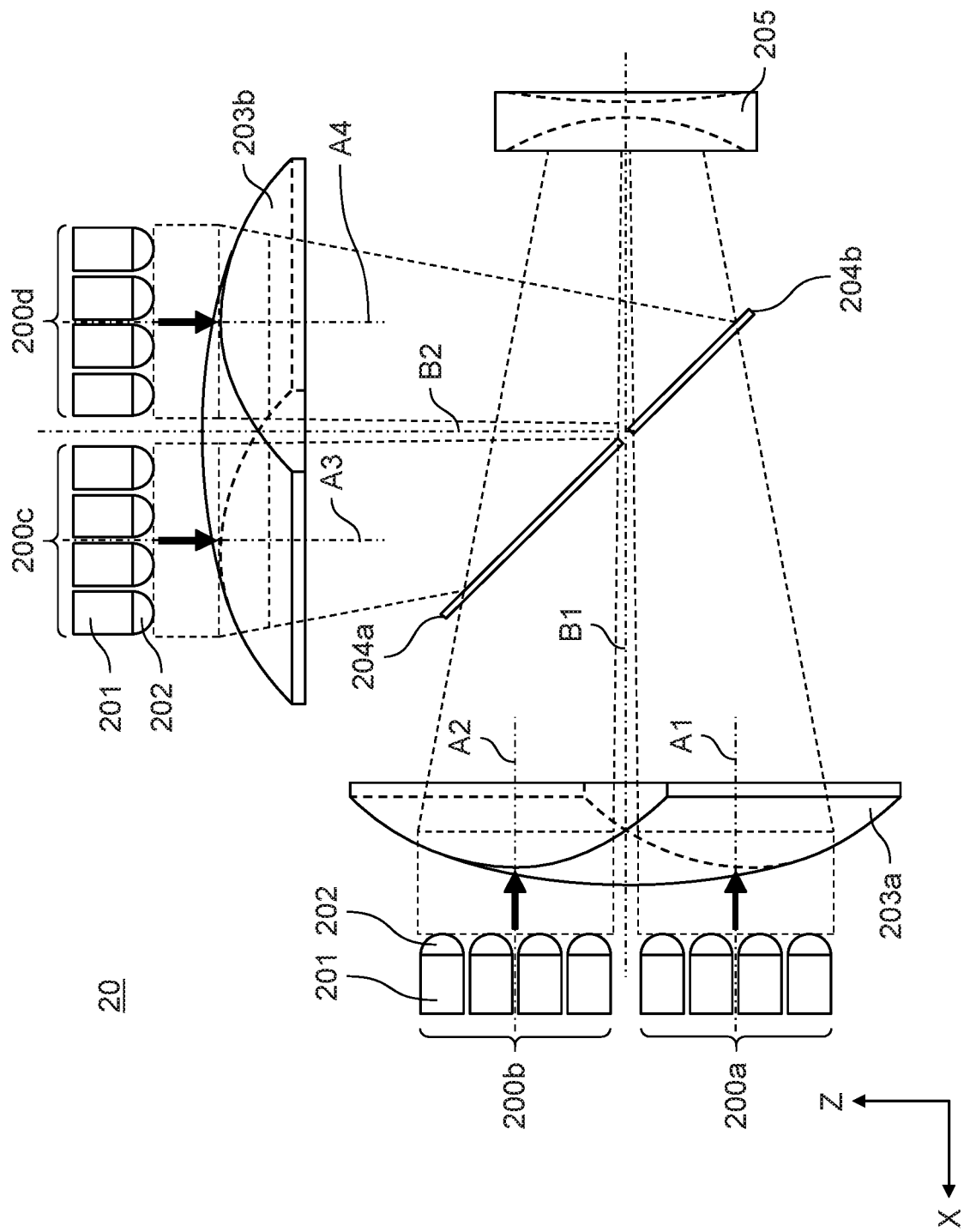
FIG. 6 is a top view of light source device 20 shown in FIG. 1.
Figure 7:
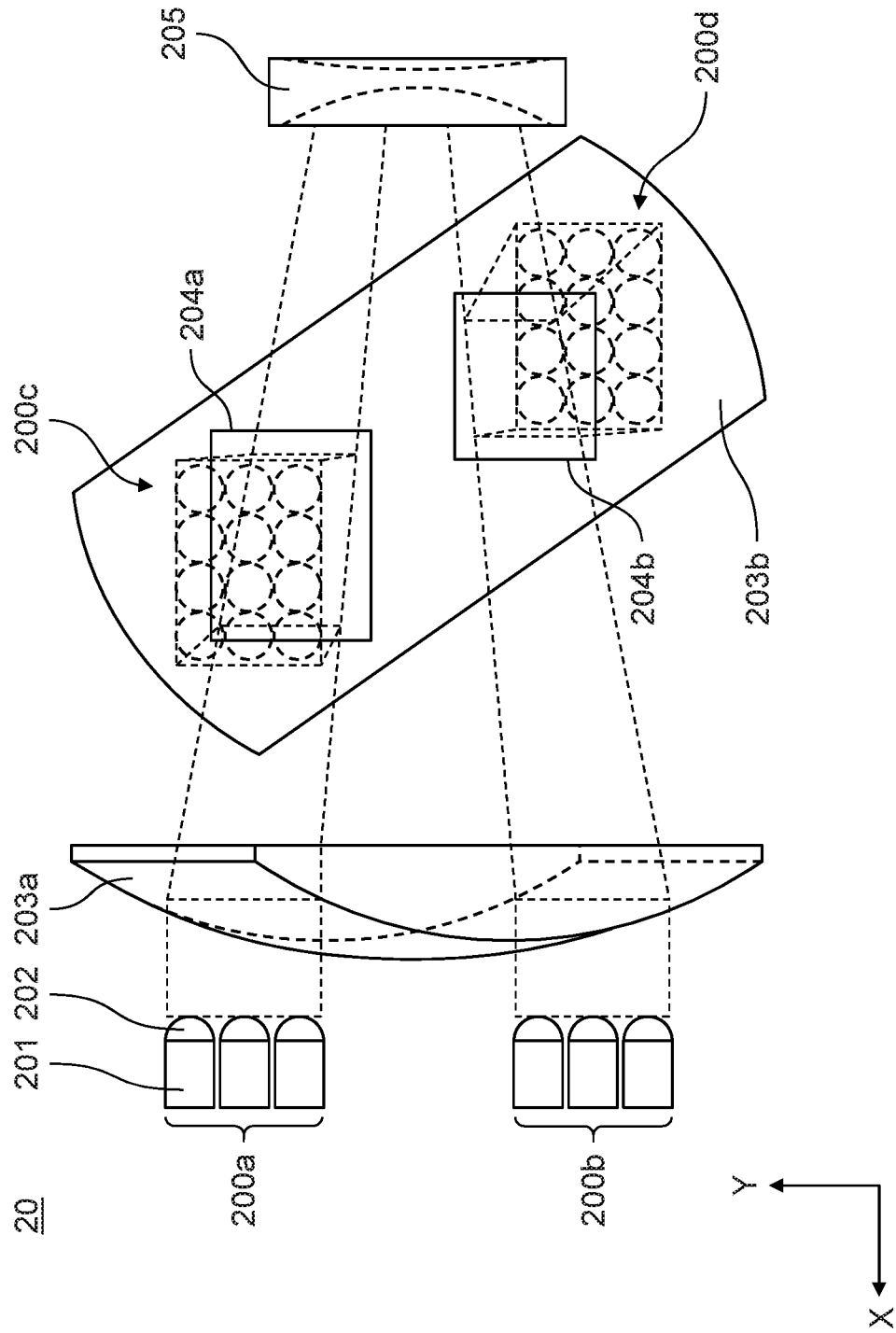
FIG. 7 is a side view of light source device 20 shown in FIG. 1.
Figure 8:
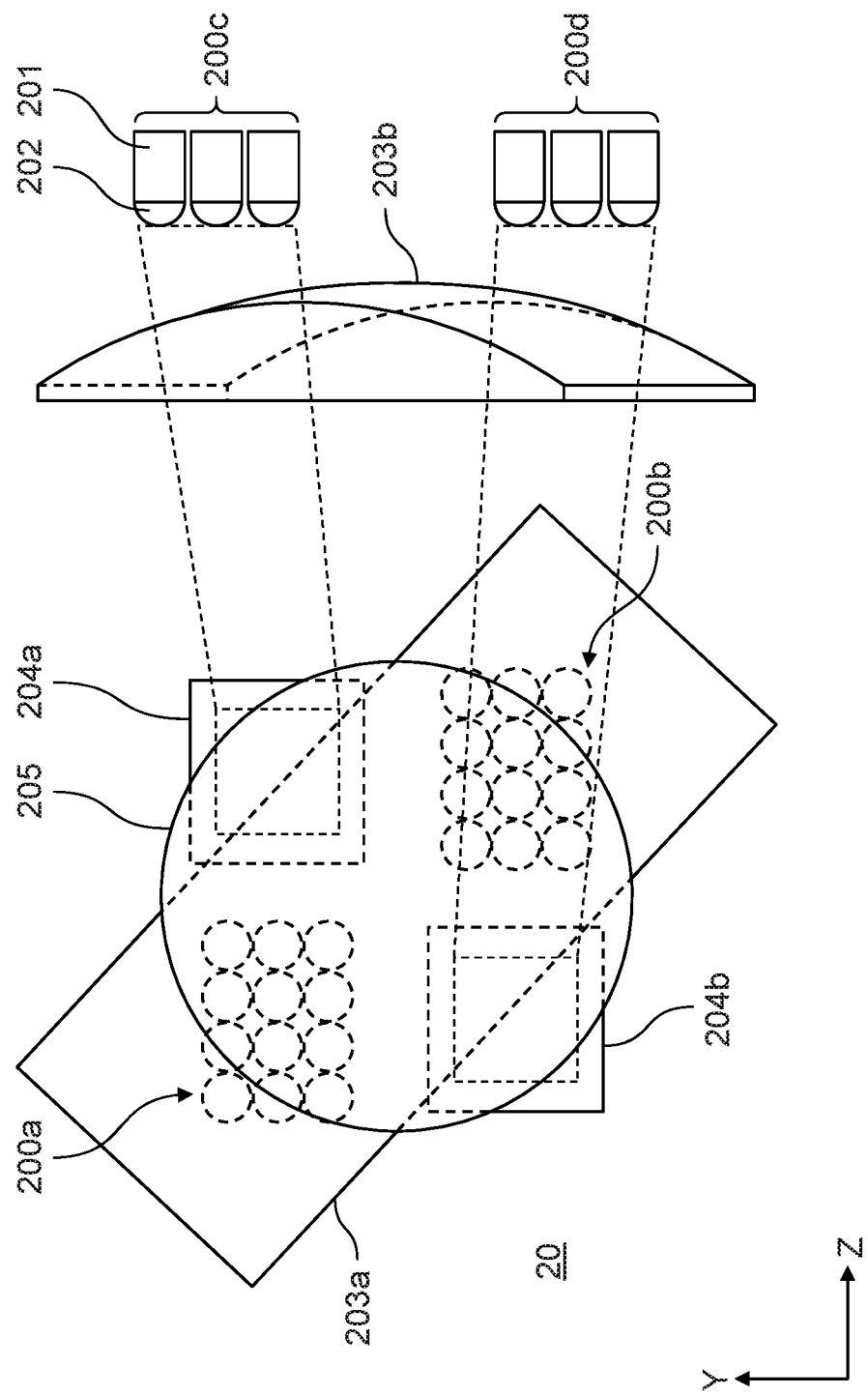
FIG. 8 is a front view of light source device 20 shown in FIG. 1.

FIG. 5 is a perspective view of light source device 20 shown in FIG. 1. FIGS. 6, 7, and 8 are top, side, and front views, respectively, of device 20.

As described above, light source device 20 includes light source units 200a to 200d, lenses 203a, 203b, and 205, and reflective mirrors 204a and 204b. These components are placed to meet both of the following conditions. One is that the light from units 200a and 200b enters lens 205 after passing through lens 203a and mirror 204a or 204b. The other is that the light from units 200c and 200d enters lens 205 after passing through lens 203b and being reflected by mirror 204a or 204b. Furthermore, units 200a and 200b are placed to meet the following condition as shown in FIG. 6. The central axis A1 of the light from unit 200a and the central axis A2 of the light from unit 200b are displaced from the optical axis B1 of lens 203a. Similarly, units 200c and 200d are placed to meet the following condition. The central axis A3 of the light from unit 200c and the central axis A4 of the light from unit 200d are displaced from the optical axis B2 of lens 203b. In addition, units 200a and 200b are placed such that the light from these units 200a and 200b enters lens 203a at a position deviated from the optical axis B1 of lens 203a. Similarly, units 200c and 200d are placed such that the light from these units 200c and 200d enters lens 203b at a position deviated from the optical axis B2 of lens 203b.

Figure 9:
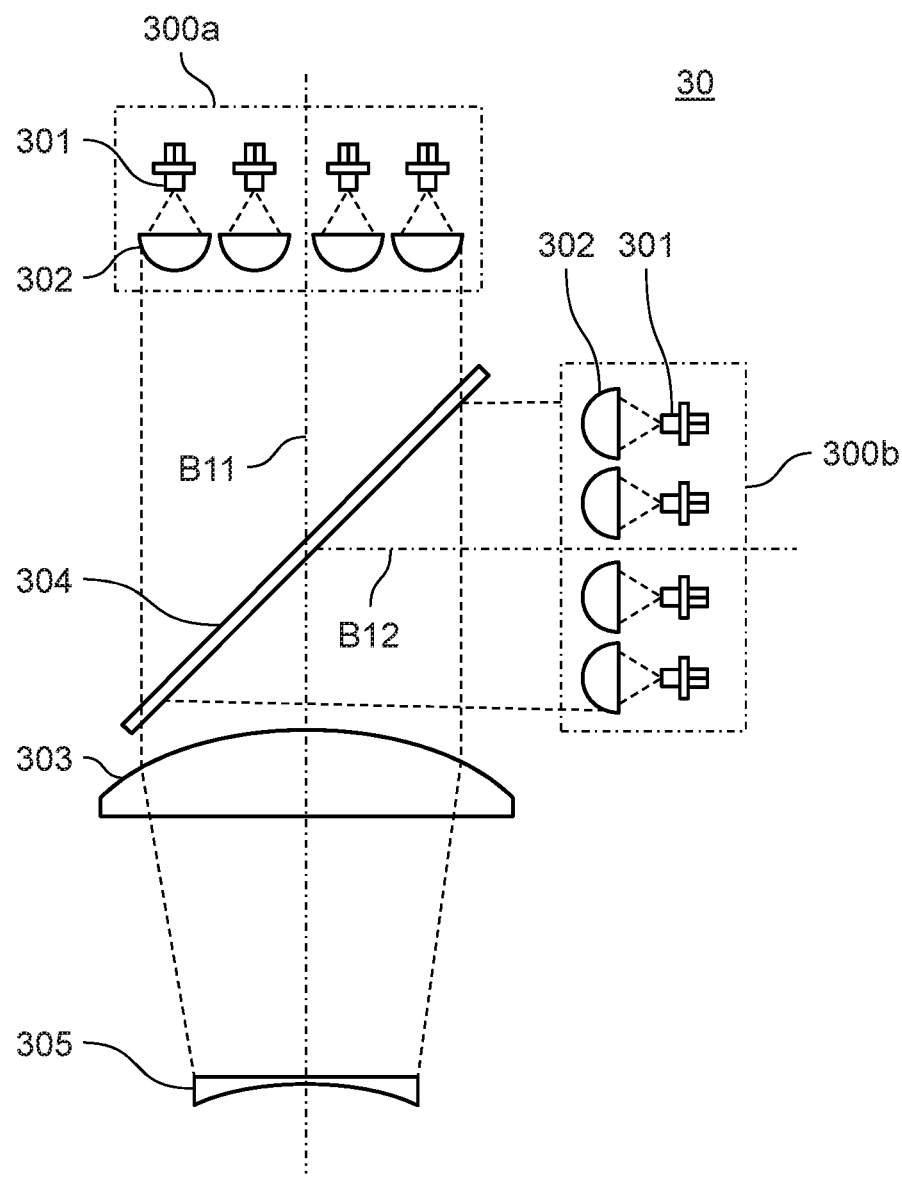
FIG. 9 is a configuration view of light source device 30 according to an example well known in the art.

FIG. 9 is a configuration view of light source device 30 according to an example well known in the art. Light source device 30 includes light source units 300a and 300b, lens 303, dichroic mirror 304, and lens 305. Each of light source units 300a and 300b includes at least one pair of semiconductor laser element 301 and collimator lens 302. The light from collimator lenses 302 of unit 300a passes through dichroic mirror 304 and enters lenses 303 and 305. Meanwhile, the light from collimator lenses 302 of unit 300b is reflected by dichroic mirror 304 and enters lenses 303 and 305. In general, lenses 303 and 305 are somewhat spaced in order to emit parallel light from lens 305. In device 30 shown in FIG. 9, lens 303 for collecting the light from units 300a and 300b is placed between mirror 304 and lens 305. This causes device 30 to be larger in size than device 20 according to the present exemplary embodiment. Furthermore, light source units 300a and 300b are placed to meet the following conditions. The central axis B11 of the light from unit 300a and the central axis B12 of the light from unit 300b coincide with the optical axis of lens 303 on lens 303.

On the other hand, light source device 20 according to the present exemplary embodiment includes light source units 200a to 200d in which semiconductor laser elements 201 and collimator lenses 202 are densely arranged. This creates sufficient space between units 200a to 200d and reflective mirrors 204a, 204b. Thus, device 20 according to the present exemplary embodiment utilizes the created space to accommodate lenses 203a and 203b. This enables device 20 to be smaller in size than device 30 according to the example well known in the art, leaving the distance between lens 205 and lenses 203a, 203b. Furthermore, the inventors of the present disclosure have found that the high-luminance light source device can be achieved by displacing the central axis of the light emitted from the light source units from the optical axis of the lens on which the light is incident and by increasing the number of light source units. A lens with low spherical aberration can fully collect the parallel light from light source units even when the central axis of the light of the light source units is displaced from the optical axis of the lens on which the light is incident. Such a lens can be designed by, for example, making its focal length relatively long. To achieve the high-luminance light source device, light source units 200a to 200d, lenses 203a and 203b, reflective mirrors 204a and 204b, and lens 205 are placed to meet the following condition. The central axis of each of the light from units 200a to 200d is displaced from the optical axis B1 or B2 of, respectively, lens 203a or 203b on lens 203a or 203b. As a result, the light from units 200a to 200d can be fully collected by lenses 203a, 203b, and 205 and mirrors 204a, 204b, thereby achieving the high-luminance light source device without significantly increasing its size.

Furthermore, the intensity of the light that enters one lens (either lens 203a or 203b) from semiconductor laser elements 201 is lower in device 20 according to the present exemplary embodiment than in device 30 of the example well known in the art. This can reduce thermal strain caused by the light absorption of the lens.

1-1-3. Modified Examples

Figure 10:
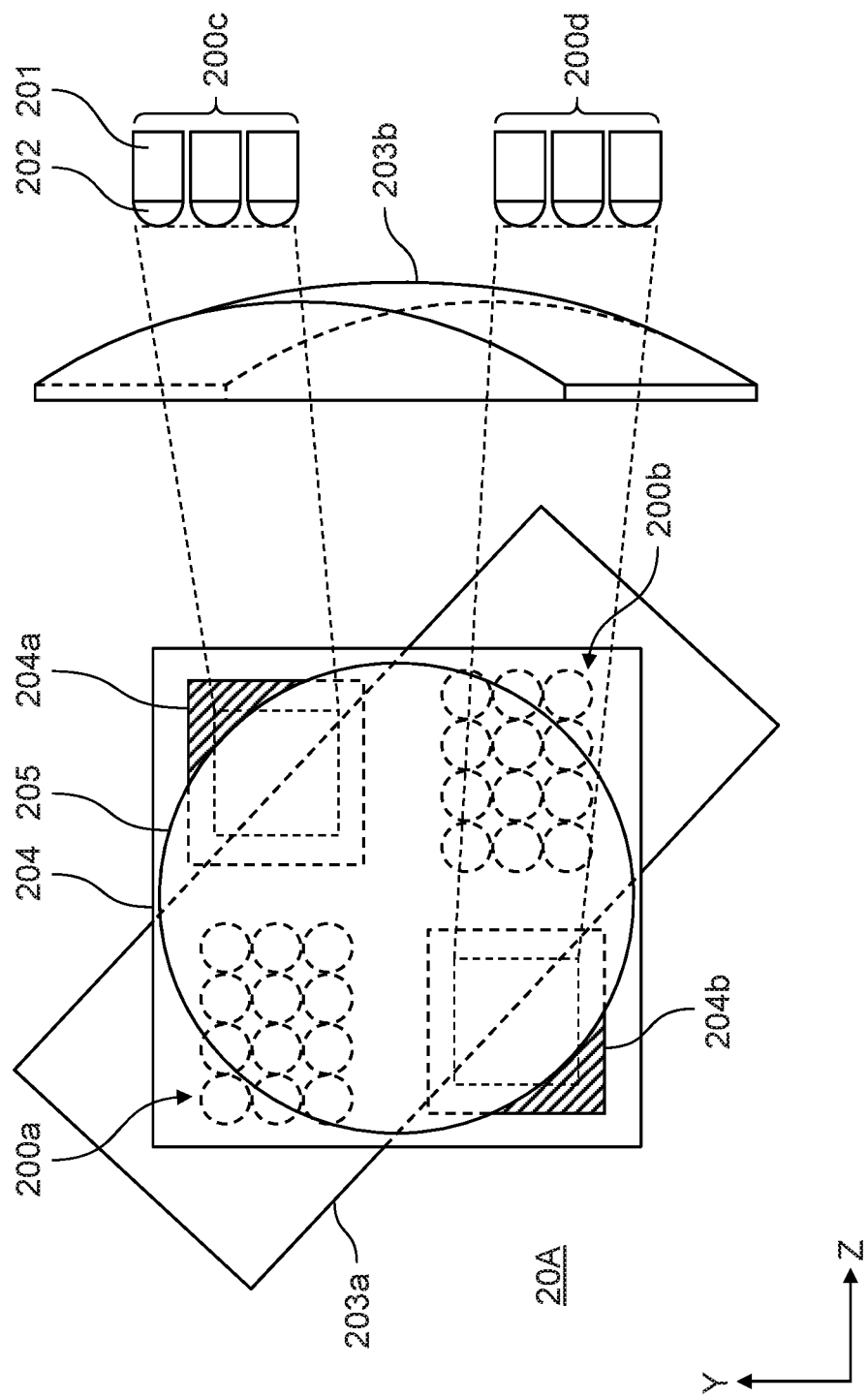
FIG. 10 is a configuration view of light source device 20A according to a first modified example of the first exemplary embodiment.

FIG. 10 is a configuration view of light source device 20A according to a first modified example of the first exemplary embodiment. Device 20A includes substrate 204 having a reflective area and a transmissive area. Reflective mirrors 204a and 204b are formed in the reflective area of substrate 204. The light from light source units 200a and 200b passes through lens 203a and the transmissive area of substrate 204, and then enters lens 205. Thus, integrating mirrors 204a and 204b into substrate 204 can reduce the number of components of light source device 20.

Alternatively, the light source device according to the present exemplary embodiment may include at least three light source units as will be described with reference to FIGS. 11 and 12.

Figure 11:
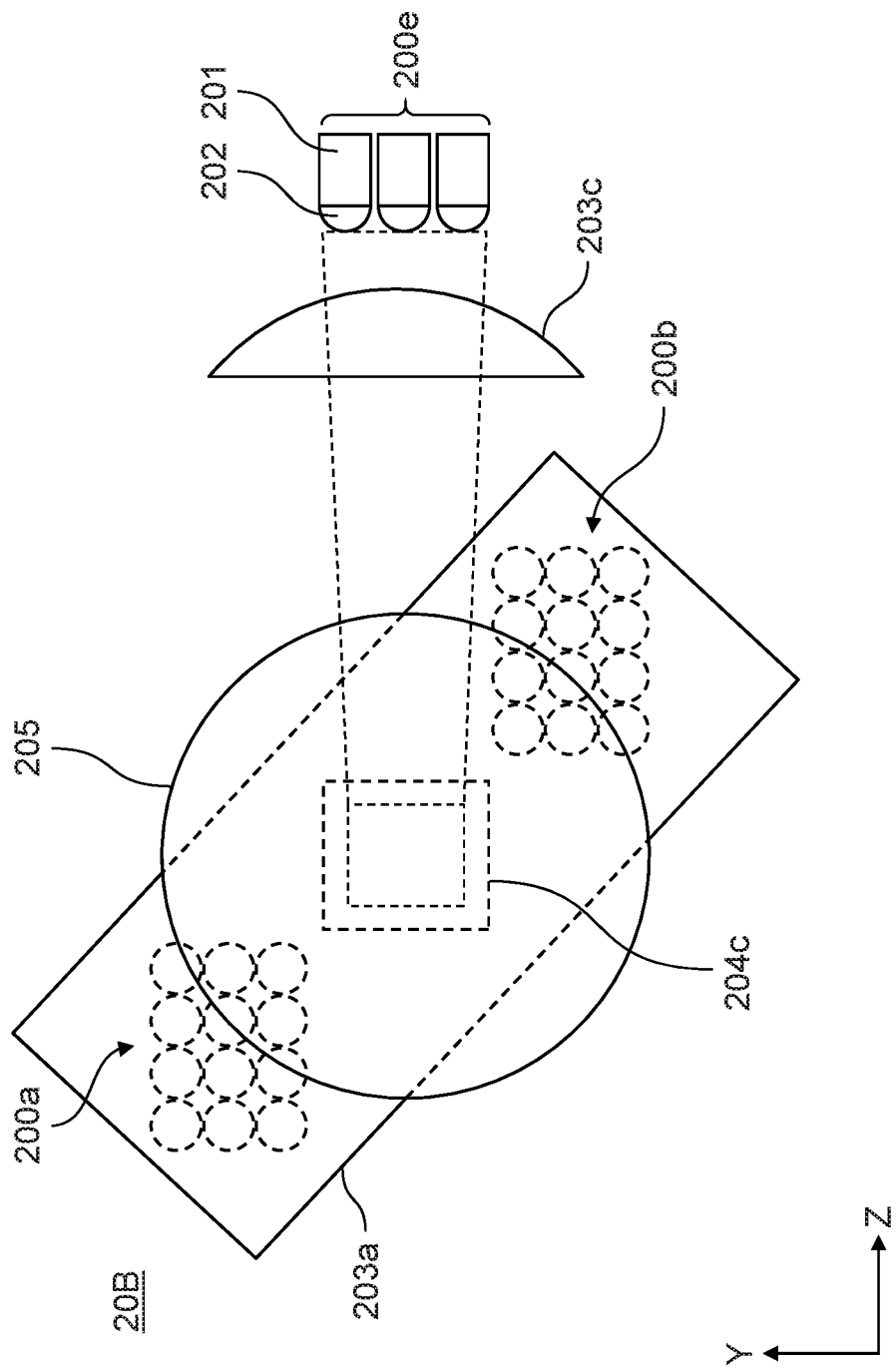
FIG. 11 is a configuration view of light source device 20B according to a second modified example of the first exemplary embodiment.

FIG. 11 is a configuration view of light source device 20B according to a second modified example of the first exemplary embodiment. Device 20B includes light source unit 200e, lens 203c, and reflective mirror 204c, instead of light source units 200c and 200d, lens 203b, and reflective mirrors 204a and 204b of device 20 shown in FIG. 1. In device 20B, too, light source units 200a and 200b are placed such that the central axis of each of the light from these units 200a and 200b is displaced from the optical axis of lens 203a. This enables the light from light source units 200a, 200b, and 200e to be fully collected by lens 203a or 203c and mirror 204a or 204c, thereby providing high luminance without significantly increasing the size of light source device 20B.

Figure 12:
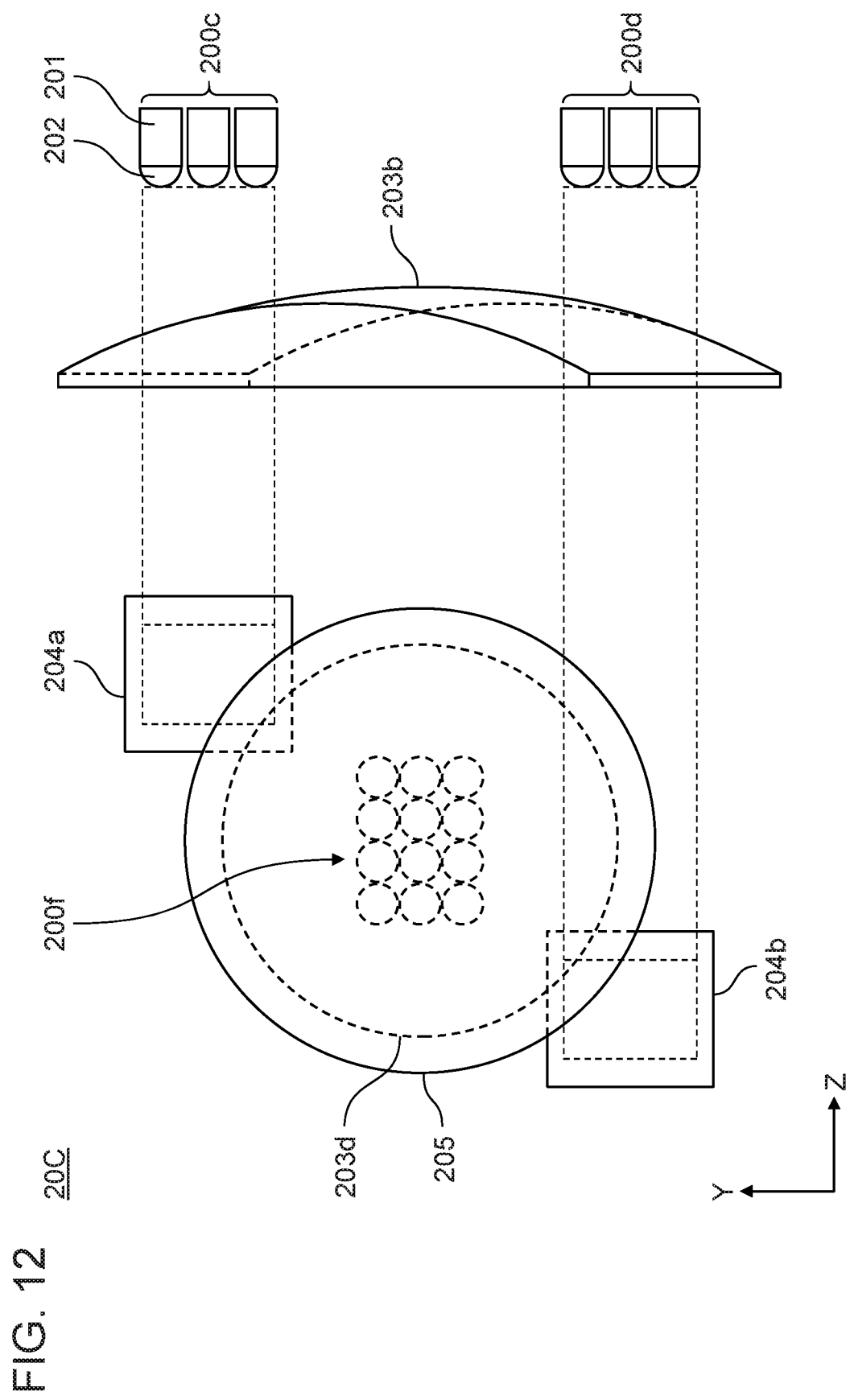
FIG. 12 is a configuration view of light source device 20C according to a third modified example of the first exemplary embodiment.

FIG. 12 is a configuration view of light source device 20C according to a third modified example of the first exemplary embodiment. Device 20C includes light source unit 200f and lens 203d instead of light source units 200a, 200b and lens 203a of device 20 shown in FIG. 1. In device 20C, too, light source units 200c and 200d are placed such that the central axis of each of the light from these units 200c and 200d is displaced from the optical axis of lens 203b. This enables the light from light source units 200c, 200d, and 200f to be fully collected by lens 203b or 203d and mirror 204a or 204c, thereby providing high luminance without significantly increasing the size of light source device 20C.

1-2. Effects and Others

Light source device 20 according to the first exemplary embodiment includes at least three of light source units 200a to 200d, lenses 203a, 203b, and 205, and at least one of mirrors 204a and 204b. These components are placed to meet both of the following conditions. One is that the light from at least one of first light source units 200a and 200b enters lens 205 after passing through lens 203a and mirror 204a or 204b. The other is that the light from second light source units 200c and 200d enters lens 205 after passing through lens 203b and being reflected by mirror 204a or 204b. First light source units 200a, 200b and/or second light source units 200c, 200d are placed such that the light from units 200a to 200d either enters lens 203a at a position deviated from the optical axis of lens 203a or enters lens 203b at a position deviated from the optical axis of lens 203b. To be more specific, in light source device 20B according to the second modified example shown in FIG. 11, the central axis of the light from at least one of light source units 200a and 200b can be displaced from the optical axis of lens 203a. Similarly, in light source device 20C according to the third modified example shown in FIG. 12, the central axis of the light from at least one of light source units 200c and 200d can be displaced from the optical axis of lens 203b. Thus, each of the light source devices 20, 20A, 20B, and 20C according to the present exemplary embodiment includes: a first light source unit that emits first light; a second light source unit that emits second light; a third light source unit that emits third light; first, second, and third lenses; and a mirror. The first light enters the third lens after passing through the first lens and the mirror. The second light enters the third lens after passing through the second lens and being reflected by the mirror. The third light enters either the first lens or the second lens, the central axis of the third light being displaced from the optical axis of either the first lens or the second lens on which the third light is incident. Thus, the central axis of the light from the third light source unit is displaced from the optical axis of the first or second lens, so that the third light source unit can be flexibly positioned with respect to the first or second lens. This enables increasing the number of light source units without significantly increasing the size of light source devices 20, 20A, 20B, and 20C as a whole. This achieves the high-luminance light source device without significantly increasing its size.

In light source device 20 according to the first exemplary embodiment, lenses 203a and 203b may be convex lenses whereas lens 205 may be a concave lens.

Light source device 20 according to the first exemplary embodiment may further include a substrate having a reflective area and a transmissive area. In this case, reflective mirrors 204a and 204b are located in the reflective area of the substrate, and the light from first light source units 200a and 200b enters lens 205 after passing through lens 203a and the transmissive area of the substrate.

Projection display apparatus 1 according to the first exemplary embodiment includes: light source device 20 that generates light; a light modulation element that spatially modulates light; a first optical system that causes the light generated by light source device 20 to enter the light modulation element; and a second optical system that projects the light spatially modulated by the light modulation element.

This achieves the high-luminance light source device without significantly increasing its size.

Second Exemplary Embodiment 2-1. Configuration of Second Exemplary Embodiment

Figure 13:
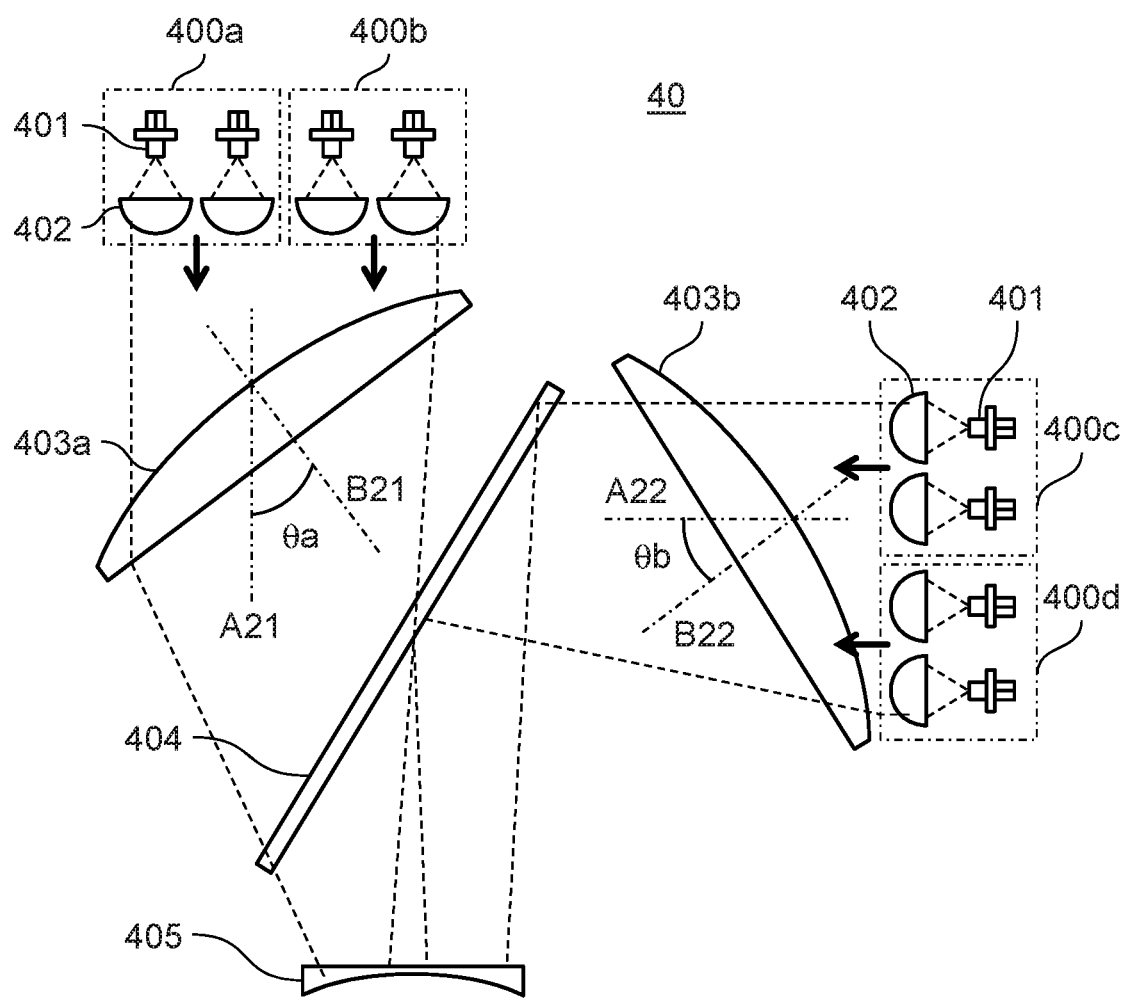
FIG. 13 is a configuration view of light source device 40 according to a second exemplary embodiment.

FIG. 13 is a configuration view of light source device 40 according to a second exemplary embodiment.

Light source device 40 includes light source units 400a to 400d, lenses 403a and 403b, reflective mirror 404, and lens 405. Each of light source units 400a to 400d includes at least one pair of semiconductor laser element 401 and collimator lens 402.

Light source units 400a to 400d, lenses 403a, 403b, and 405, and mirror 404 are placed to meet both of the following conditions. One is that the light from units 400a and 400b enters lens 405 after passing through lens 403a and mirror 404. The other is that the light from units 400c and 400d enters lens 405 after passing through lens 403b and being reflected by mirror 404. Units 400a and 400b are placed such that the light (travelling along the axis A21) from these units 400a and 400b enters lens 403a at a non-zero incident angle θa with respect to the optical axis B21 of lens 403a. Similarly, units 400c and 400d are placed such that the light (travelling along the axis A22) from these units 400c and 400d enters lens 403b at a non-zero incident angle θb with respect to the optical axis B22 of lens 403b.

In light source device 40 according to the present exemplary embodiment, light source units 400a to 400d, lenses 403a and 403b, reflective mirror 404, and lens 405 are placed to meet the following condition. The light from units 400a to 400d enters lens 403a or 403b at a non-zero incident angle θa or θb with respect to the optical axis B21 of lens 403a or the optical axis B22 of lens 403b, respectively. Thus, the light from units 400a to 400d can be fully collected by lenses 403a, 403b, and 405 and mirror 404, thereby achieving the high-luminance light source device without significantly increasing its size. In the present exemplary embodiment, the light from all of light source units 400a to 400d has a non-zero incident angle θa or θb with respect to lens 403a or 403b; however, this is not the only option available. It is only required that the light from at least one of units 400a to 400d has a non-zero incident angle θa or θb with respect to lens 403a or 403b. Also, in the present exemplary embodiment, the light from two light source units enters lenses 403a and 403b; however, this is not the only option available. It is only required that a plurality of light source units are placed to face at least one of lenses 403a and 403b.

2-2. Effects and Others

Light source device 40 according to the second exemplary embodiment includes at least three of light source units 400a to 400d, lenses 403a, 403b, and 405, and reflective mirror 404. These components are placed to meet both of the following conditions. One is that the light from at least one of first light source units 400a and 400b enters lens 405 after passing through lens 403a and mirror 404. The other is that the light from second light source units 400c and 400d enters lens 405 after passing through lens 403b and being reflected by mirror 404. First light source units 400a, 400b and/or second light source units 400c, 400d are placed such that the light from units 400a to 400d either enters lens 403a at a non-zero incident angle with respect to the optical axis of lens 403a or enters lens 403b at a non-zero incident angle with respect to the optical axis or lens 403b. Light source device 40 according to the present exemplary embodiment includes light source units 400a to 400d in which semiconductor laser elements 401 and collimator lenses 402 are densely arranged. This creates sufficient space between units 400a to 400d and reflective mirror 404. Thus, device 40 according to the present exemplary embodiment utilizes the created space to accommodate lenses 403a and 403b. This enables device 40 to be smaller in size than device 30 according to the example well known in the art, leaving the distance between lens 405 and lenses 403a, 403b. Furthermore, in device 40 according to the present exemplary embodiment, the light from the plurality of light source units enters at least one of lenses 403a and 403b, and the light from at least one of the plurality of light source units enters the lens at a non-zero incident angle with respect to the optical axis of the lens on which the light is incident. Thus, light source device 40 includes: a first light source unit that emits first light; a second light source unit that emits second light; a third light source unit that emits third light; first, second, and third lenses; and a mirror. The first light enters the third lens after passing through the first lens and the mirror. The second light enters the third lens after passing through the second lens and being reflected by the mirror. The third light enters either the first lens or the second lens at a non-zero incident angle with respect to the optical axis of either the first lens or the second lens on which the third light is incident.

Thus, the light from the third light source unit has a non-zero incident angle with respect to the optical axis of the first or second lens, so that the third light source unit can be flexibly positioned with respect to the first or second lens. This enables increasing the number of light source units without significantly increasing the size of light source device 40 as a whole. This achieves the high-luminance light source device without significantly increasing its size.

Third Exemplary Embodiment 3-1. Configuration of Third Exemplary Embodiment

Figure 14:
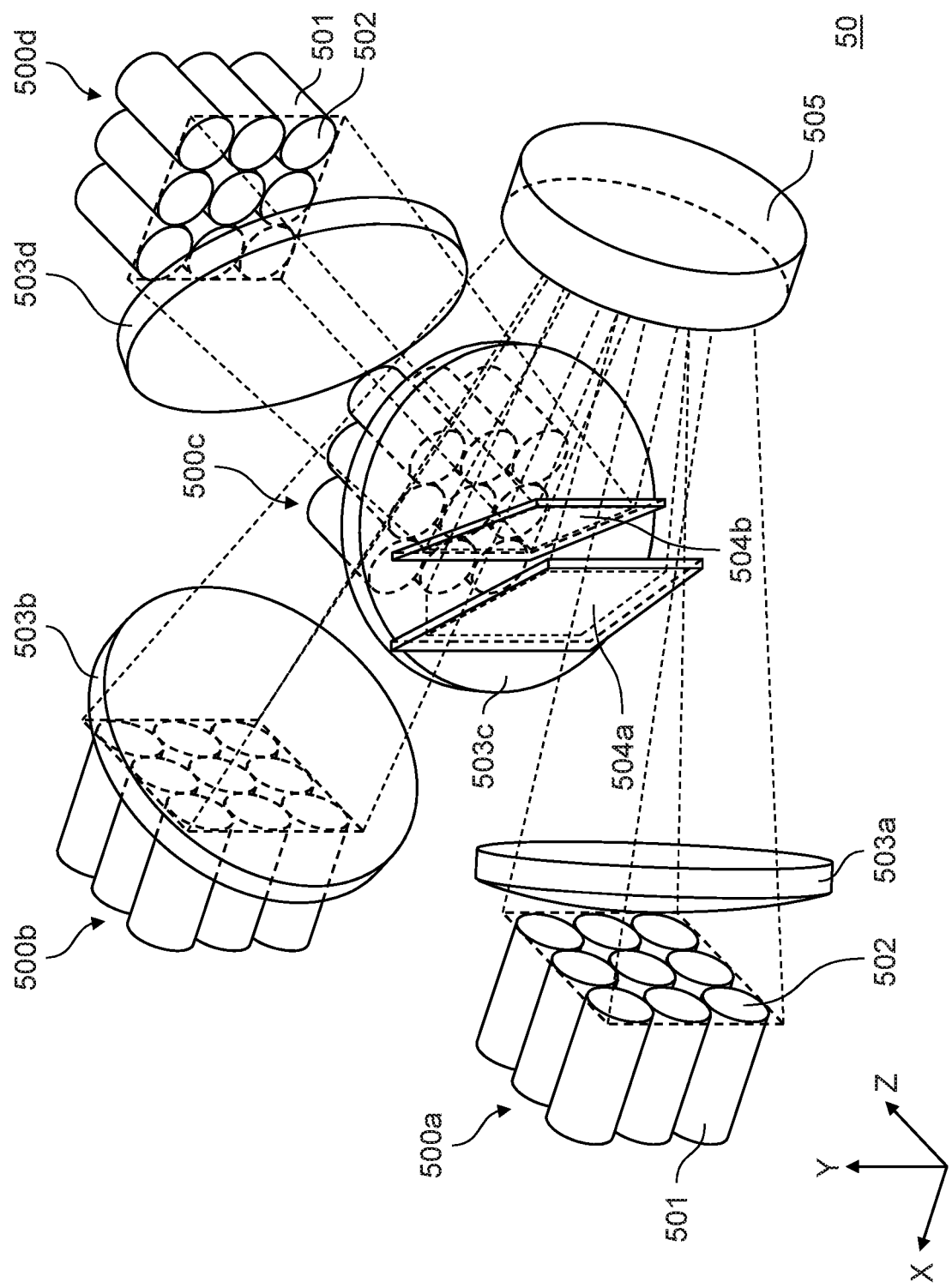
FIG. 14 is a side view of light source device 50 according to a third exemplary embodiment.
Figure 15:
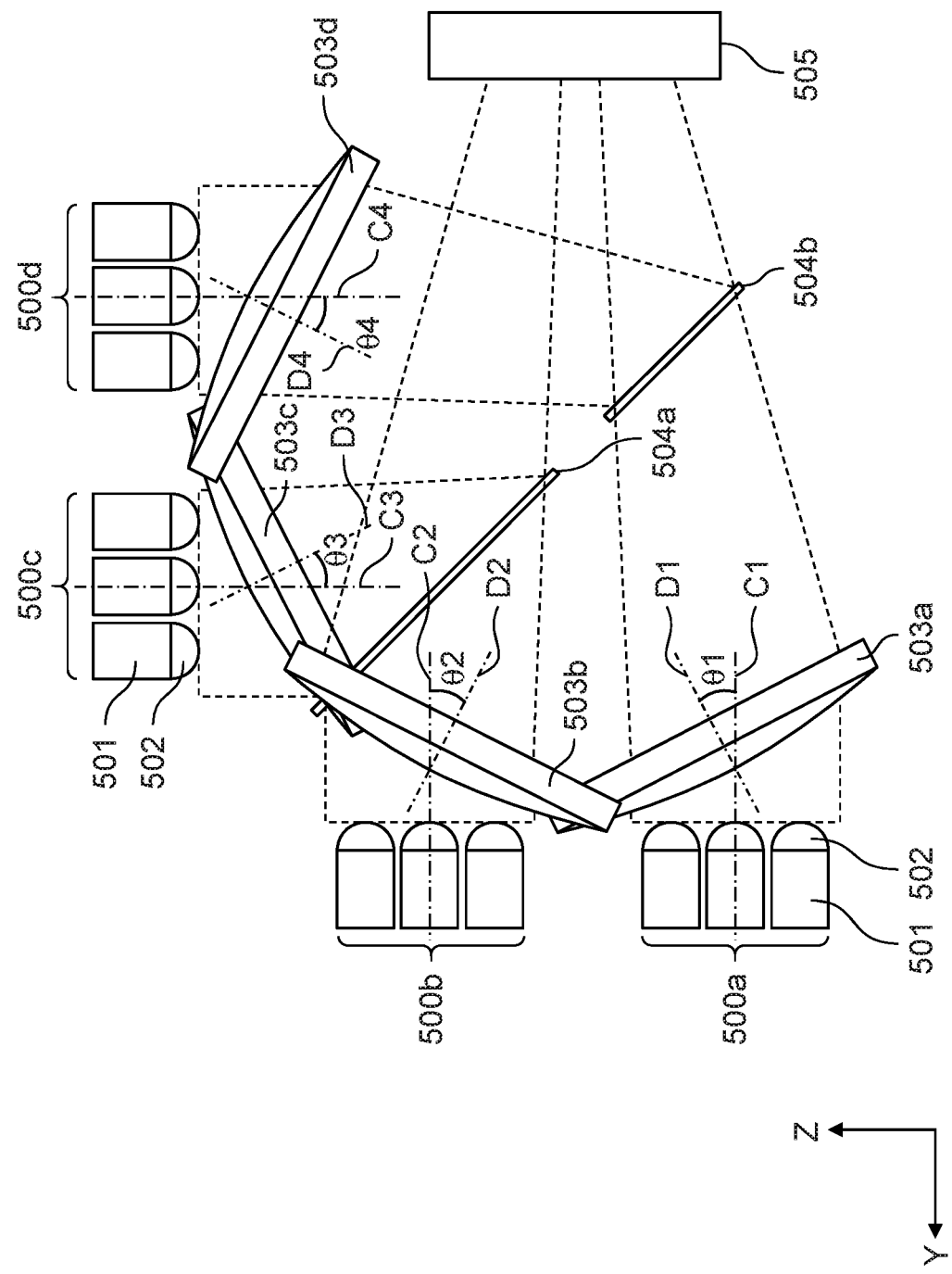
FIG. 15 is a top view of light source device 50 shown in FIG. 14.
Figure 16:
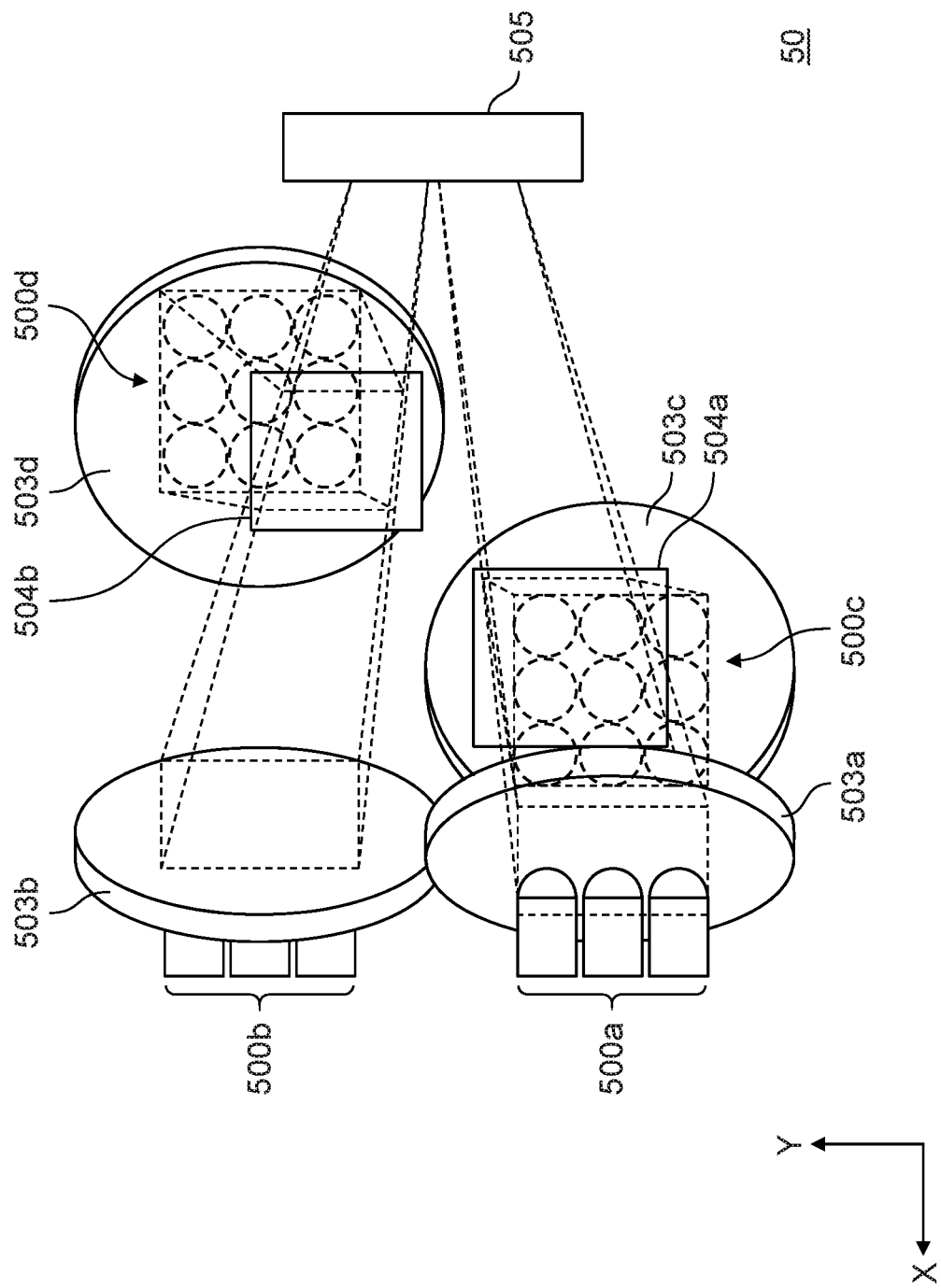
FIG. 16 is a side view of light source device 50 shown in FIG. 14.
Figure 17:
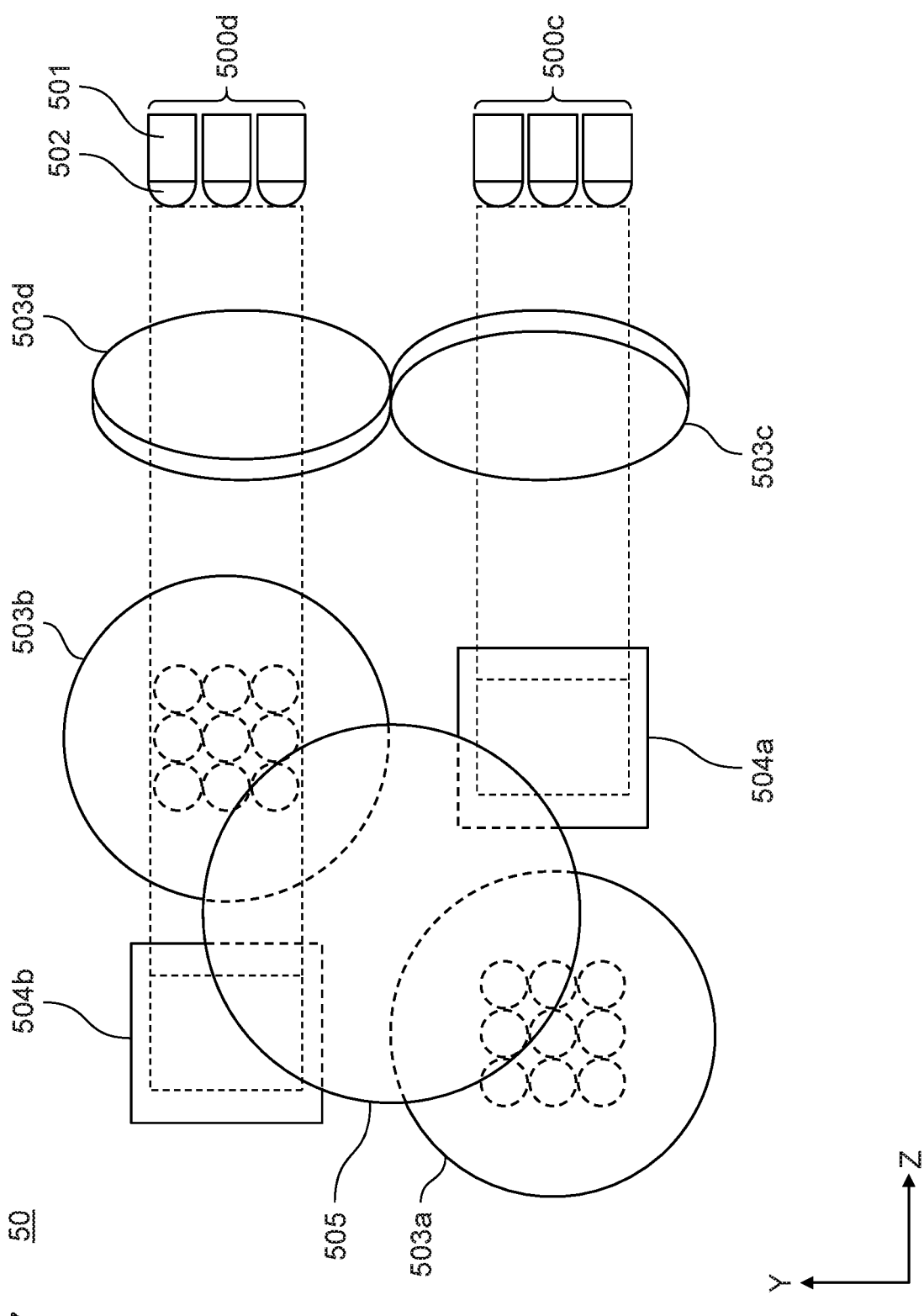
FIG. 17 is a front view of light source device 50 shown in FIG. 14.

FIG. 14 is a side view of light source device 50 according to a third exemplary embodiment. FIGS. 15, 16, and 17 are top, side, and front views, respectively, of device 50.

Light source device 50 includes light source units 500a to 500d, lenses 503a to 503d, reflective mirrors 504a and 504b, and lens 505. Each of light source units 500a to 500d includes at least one pair of semiconductor laser element 501 and collimator lens 502.

Light source units 500a to 500d, lenses 503a to 503d and 505, and mirrors 504a and 504b are placed to meet both of the following conditions. One is that the light from light source units 500a and 500b enters lens 505 after passing through lens 503a or 503b and mirror 504a or 504b. The other is that the light from light source units 500c and 500d enters lens 505 after passing through lens 503c or 503d and being reflected by mirror 504a or 504b. The light from units 500a to 500d travels along axes C1 to C4, respectively. Unit 500a is placed such that its light (travelling along the axis C1) enters lens 503a at a non-zero incident angle θ1 with respect to the optical axis D1 of lens 503a. Similarly, unit 500b is placed such that its light (travelling along the axis C2) enters lens 503b at a non-zero incident angle θ2 with respect to the optical axis D2 of lens 503b. Unit 500c is placed such that its light (travelling along the axis C3) enters lens 503c at a non-zero incident angle θ3 with respect to the optical axis D3 of lens 503c. Unit 500d is placed such that its light (travelling along the axis C4) enters lens 503d at a non-zero incident angle θ4 with respect to the optical axis D4 of lens 503d.

In light source device 50 according to the present exemplary embodiment, light source units 500a to 500d, lenses 503a to 503d, reflective mirrors 504a and 504b, and lens 505 are placed to meet the following condition. The light from light source units 500a to 500d enters lenses 503a to 503d at non-zero incident angles θ1 to θ4 with respect to the optical axes D1 to D4 of lenses 503a to 503d, respectively. Thus, the light from units 500a to 500d can be fully collected by lenses 503a to 503d and 505 and mirrors 504a, 504b. This achieves the high luminance light source device without significantly increasing its size.

3-2. Effects and Others

Light source device 50 according to the third exemplary embodiment includes at least three of light source units 500a to 500d, at least one of lenses 503a and 503b, at least one of lenses 503c and 503d, lens 505, and at least one of reflective mirrors 504a and 504b. These components are placed to meet both of the following conditions. One is that the light from at least one of first light source units 500a and 500b enters lens 505 after passing through lenses 503a to 503d and mirrors 504a or 504b. The other is that the light from second light source units 500c and 500d enters lens 505 after passing through lenses 503c or 503d and being reflected by mirror 504a or 504b. First light source units 500a, 500b and/or second light source units 500c, 500d are placed such that the light from units 500a to 500d either enters lenses 503a to 503d at a non-zero incident angle with respect to the optical axis of lenses 503a to 503d, or enters lenses 503c and 503d at a non-zero incident angle with respect to the optical axis of lenses 503c and 503d.

This achieves the high luminance light source device without significantly increasing its size.

The first to third exemplary embodiments have been so far described as examples of the technique of the present application. However, the technique of the present disclosure is not limited to these embodiments and can be applied to other embodiments obtained by modification, replacement, addition, omission, etc. Furthermore, the components described in the above embodiments may be combined to form additional embodiments.

In these exemplary embodiments, the lenses that the light from the light source units enters first may be a single lens having a plurality of areas, such as a circular convex lens having a plurality of fan-shaped areas.

INDUSTRIAL APPLICABILITY

The light source device according to the aspects of the present disclosure is applicable to a projection display apparatus such as a projector.

What is claimed is:

1. A light source device comprising:
a first light source unit configured to emit first light;
a second light source unit configured to emit second light;
a third light source unit configured to emit third light;
first, second, and third lenses; and
a mirror,
wherein
the first light enters the third lens after passing through the first lens and the mirror,
the second light enters the third lens after passing through the second lens and being reflected by the mirror, and
the third light enters either the first lens or the second lens,
a central axis of the third light being displaced from an optical axis of either the first lens or the second lens on which the third light is incident.

2. A light source device comprising:
a first light source unit configured to emit first light;
a second light source unit configured to emit second light;
a third light source unit configured to emit third light;
first, second, and third lenses; and
a mirror,
wherein
the first light enters the third lens after passing through the first lens and the mirror,
the second light enters the third lens after passing through the second lens and being reflected by the mirror, and the third light enters either the first lens or the second lens at a non-zero incident angle with respect to an optical axis of either the first lens or the second lens on which the third light is incident.

3. The light source device according to claim 1, wherein the first lens and the second lens are convex lenses, and the third lens is a concave lens.

4. The light source device according to claim 1, further comprising a substrate having a reflective area and a transmissive area, wherein the mirror is located in the reflective area of the substrate, and the first light enters the third lens after passing through the first lens and the transmissive area of the substrate.

5. A projection display apparatus comprising:

the light source device according to claim 1, the light source device being configured to generate light;

a light modulation element configured to spatially modulate light;

a first optical system configured to cause the light generated by the light source device to enter the light modulation element; and a second optical system configured to project the light spatially modulated by the light modulation element.

* * * * *